United States Patent [19]
Tokuda

[11] Patent Number: 6,103,433
[45] Date of Patent: *Aug. 15, 2000

[54] EXPOSURE METHOD USING RETICLE REMOUNT FOR TEMPERATURE INFLUENCE CORRECTION

[75] Inventor: Yukio Tokuda, Kawasaki, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/039,316

[22] Filed: Mar. 16, 1998

[30] Foreign Application Priority Data

Mar. 17, 1997 [JP] Japan .................................. 9-082446
Mar. 3, 1998 [JP] Japan .................................. 10-066088

[51] Int. Cl.⁷ ........................................................ G03F 9/00
[52] U.S. Cl. .................................................. 430/30; 430/22
[58] Field of Search ........................... 430/30, 22; 378/34, 378/35, 208, 205; 250/453.11; 279/3

[56] References Cited

U.S. PATENT DOCUMENTS 5,329,126 7/1994 Amemiya et al. ................. 250/453.11
5,680,428 10/1997 Amemiya et al. ........................ 378/34

*Primary Examiner*—Christopher G. Young
*Attorney, Agent, or Firm*—Fitzpatrick, Cella, Harper & Scinto

[57] ABSTRACT

An exposure method includes holding a reticle fixed, holding a wafer fixed, irradiating the reticle with an exposure beam, projecting an image of the irradicated reticle onto the wafer through a projection optical system, and re-mounting the reticle as the temperature of the reticle reaches or exceeds a predetermined temperature.

24 Claims, 3 Drawing Sheets

EXPOSURE METHOD USING RETICLE REMOUNT FOR TEMPERATURE INFLUENCE CORRECTION

FIELD OF THE INVENTION AND RELATED ART

This invention relates generally to an exposure apparatus and a device manufacturing method using the same. More particularly, the invention is concerned with an exposure process for exposing, by exposure with an exposure apparatus (e.g., a semiconductor manufacturing apparatus), a substrate such as a wafer to an original such as a mask or reticle with high precision.

Further miniaturization and enhancement of integration of a semiconductor integrated circuit such as an IC or LSI has forced further improvement of precision and performance of semiconductor exposure apparatuses. Particularly, as regards alignment procedure, a precision of superposing an original and a substrate with an order of several tens of nanometers is required.

Examples of exposure apparatuses for use in the manufacture of semiconductor devices are steppers and step-and-scan exposure apparatuses. In such exposure apparatuses, while a substrate (e.g., semiconductor wafer) is moved stepwise, a pattern formed on an original is sequentially transferred to different locations on the substrate. An apparatus wherein transfer of a single pattern is made at once is called a "stepper" or "step-and-repeat exposure apparatus", and an apparatus wherein transfer of a single pattern is made during scanning motion of a stage is called a "step-and-scan exposure apparatus". They differ in operation during the exposure procedure, but they have a similarity in basic operation (step-and-repeat operation) wherein pattern transfer is repeated with stepwise motion interposed.

As regards the alignment procedure for an original and a substrate in semiconductor exposure apparatuses, there is a problem in that thermal expansion of an original, such as a reticle, produces deformation, causing non-linear distortion of a pattern of the reticle.

SUMMARY OF THE INVENTION

It is an object of the present invention to provide a system by which an original and a substrate to be exposed can be aligned with each other at higher precision.

It is another object of the present invention to provide a system by which a non-linear distortion component of an original such as a reticle can be removed.

According to investigations made by the inventor, it has been found that a non-linear distortion component of an original or reticle can be removed by the following procedure: a non-linear distortion component of an original or reticle is calculated on the basis of the thermal absorption coefficient of the original, the amount of exposure light and the fixed position of the original; then a condition (e.g., temperature rise, the quantity of exposure light impinging on the original) with which the non-linear distortion component exceeds a predetermined amount, is determined; and the original or reticle is re-mounted when the above-described condition is satisfied. The present invention is based on this procedure.

In accordance with an aspect of the present invention, there is provided an exposure method, comprising the steps of: holding a reticle fixed; holding a wafer fixed; irradiating the reticle with an exposure beam; projecting an image of the reticle irradiated, onto the wafer through a projection optical system; and re-mounting the reticle as the temperature of the reticle reaches or exceeds a predetermined temperature.

In combination with the re-mounting of the reticle, a projection magnification of the projection optical system may be adjusted.

The re-mounting of the reticle may be performed when the wafer is replaced by another.

The temperature of the reticle may be determined on the basis of integration of the exposure amount.

The temperature of the reticle may be determined on the basis of the number of exposures and the interval of exposures.

The temperature of the reticle may be determined on the basis of one of transmissivity and light absorptivity of the reticle as measured beforehand.

The re-mounting of the reticle may be performed after positioning the reticle.

For re-mounting the reticle, reticle measurement may be performed and the reticle re-mounting may be made so as to minimize a non-linear distortion component.

The temperature of the reticle may be determined on the basis of a difference between (i) relative position of a mark provided on the reticle and a reference mark provided for the positioning of the reticle, and (ii) an initial relative position of respective marks.

Holding the reticle may be performed by use of vacuum attraction.

In accordance with another object of the present invention, there is provided a device manufacturing method for manufacturing devices with a procedure including a step of transferring a pattern of a reticle onto a wafer in accordance with an exposure method as recited above.

The procedure may further include a step of applying a resist to the wafer prior to the exposure process, and a step for developing the wafer after the exposure process.

In accordance with a further aspect of the present invention, there is provided an exposure apparatus, comprising: a reticle chuck for holding a reticle fixed; a wafer chuck for holding a wafer fixed; an illumination optical system for irradiating the reticle with an exposure beam; a projection optical system for projecting an image of the reticle as irradiated, onto the wafer; and means serviceable to re-mount the reticle when the temperature of the reticle reaches or exceeds a predetermined temperature.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
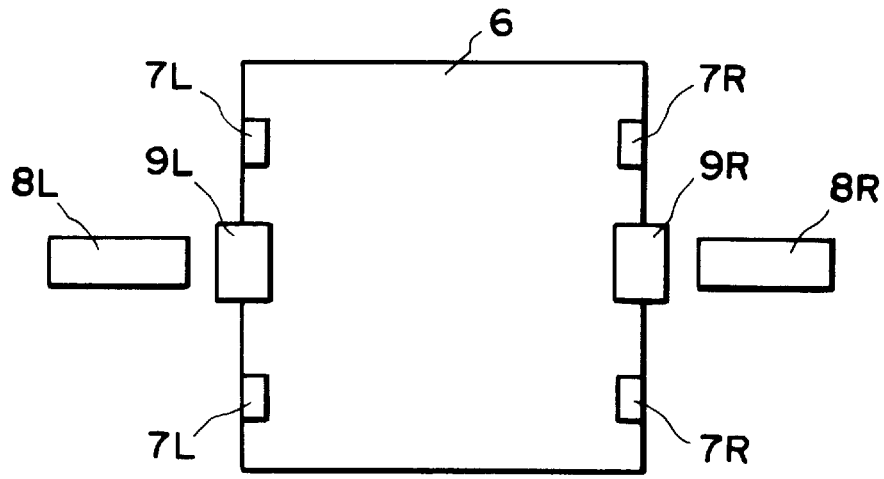
FIG. 1 is a schematic and top view of a projection exposure apparatus according to an embodiment of the present invention.
Figure 2:
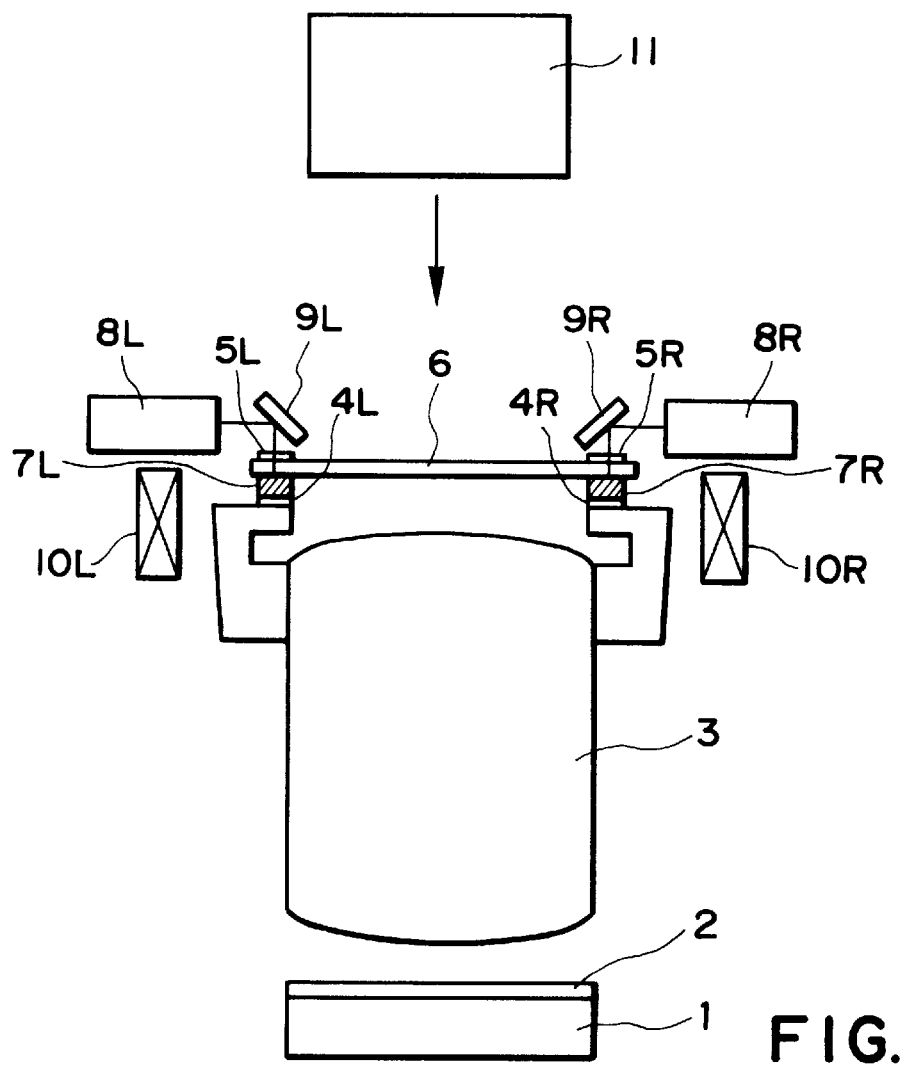
FIG. 2 is a schematic and side view of the projection exposure apparatus of FIG. 1.

Preferred embodiments of the present invention will be described in conjunction with the drawings. FIGS. 1 and 2 show a projection exposure apparatus (which may be a stepper or a scanner) usable in the present invention, wherein FIG. 1 is a top view and FIG. 2 is a side view.

Denoted in the drawings at 1 is a wafer chuck (wafer attracting table) mounted on an X-Y stage which is movable in X and Y directions along an X-Y plane, perpendicular to an optical axis of an exposure beam. Denoted at 2 is a wafer which is a substrate to be exposed. Denoted at 3 is a projection lens of a projection optical system. Denoted at 4L and 4R are two reticle reference mark means which are fixedly provided above the projection lens 3. Denoted at 5L and 5R are marks which are formed on a reticle (original) 6, in association with the reticle reference marks 4L and 4R. Denoted at 7 is a reticle chuck which is fixedly mounted above the projection lens 3, for fixedly holding the reticle 6 through vacuum attraction. The reticle chuck 7 comprises four vacuum attraction pads 7L and 7R for fixation of the reticle. Denoted at 8L and 8R are alignment optical systems for observation and measurement of the relative positions of the reticle reference marks 4 and the marks of the reticle 6. Denoted at 10 (10L and 10R) is temperature controlling means having a particle filter, for blowing a temperature controlled gas against the reticle reference marks 4L and 4R for temperature control thereof, and for maintaining the distance between them constant. Denoted at 11 is an illumination optical system for projecting an exposure beam and irradiating the reticle with the exposure beam.

The operation of the structure described above will be explained below.

Prior to the start of an exposure operation with the exposure apparatus, the light absorption factor of a reticle to be used is measured and, on the basis of this measurement, the temperature rise of the reticle to be exposed is predicted.

The procedure of an exposure operation is as follows. First, a reticle 6 is conveyed into the exposure apparatus by use of a reticle conveying hand. Then, the marks 5L and 5R formed on the reticle are observed by using the measurement alignment optical systems 8L and 8R, and the reticle is positioned by means of the reticle stage so that the marks are placed within a predetermined range. Subsequently, the reticle is held fixed within the exposure apparatus, by means of the reticle fixing vacuum pads 7L and 7R.

Thereafter, a wafer 2 is placed on the attracting table 1 by means of a wafer conveying system, whereby the wafer 2 is attracted to the table. Then, while repeating step-and-repeat operation with the X-Y stage, different regions on the wafer are sequentially exposed. After the whole wafer exposure process is completed, the wafer is unloaded by means of a wafer conveying system, not shown.

During sequential and repeated operations made in the exposure apparatus, temperature rise of the reticle is predicted on the basis of the light absorption factor of the reticle (having been measured beforehand), integrated exposure light due to the light energy actually projected to the reticle, and the environment where the reticle is placed. When it is determined that the temperature of the reticle reaches or exceeds a predetermined temperature, it is concluded that distortion of the reticle has become too large and exceeded the tolerable range. Thus, the reticle is once released and then held fixed again by vacuum attraction.

For this reticle re-mounting, the reticle position is measured, and the amount of elongation of the reticle pattern is measured. In accordance with the amount of elongation, the magnification of the projection optical system is adjusted. With this alignment procedure of the projection exposure apparatus, non-linear distortion is corrected.

Although in the above-described procedure the timing of re-attracting (re-mounting) the reticle is determined on the basis of the reticle absorption coefficient and the exposure energy, the relative positional relationship between the reticle marks and the reference marks may be measured regularly, e.g., per every wafer, and reticle re-mounting may be made on the basis of the determination as described.

The reticle re-mounting may be performed at the time of wafer replacement. This is preferable because it does not decrease the throughput of the exposure apparatus.

In this embodiment of the present invention, as described, when it is determined that the temperature of the reticle reaches or exceeds a predetermined temperature, the reticle is re-mounted. Additionally, in combination with the reticle re-mounting, the projection magnification of the projection optical system is adjusted. This enables further improvement of precision.

Here, the temperature rise of the reticle may be determined on the basis of integration of the exposure amount, e.g., the number of exposures and interval of exposures, while taking into account the transmissivity and light absorption factor of the reticle. Alternatively, the reticle temperature may be determined on the basis of the difference between (i) the relative position of the mark formed on the reticle and the reticle reference mark for reticle positioning, and (ii) the initial relative position of respective marks.

Further, for re-mounting of the reticle, the reticle positioning may be made. Also, when the reticle is to be re-mounted, reticle measurement may preferably be made and the reticle may be held fixed again so as to minimize non-linear distortion. The reticle re-mounting may preferably be made when the wafer is replaced by another.

With this embodiment of the present invention with the advantageous features described above, non-linear distortion resulting from thermal deformation of the reticle pattern can be minimized, and thus printing performance and alignment performance of the exposure apparatus can be improved.

An embodiment of a device manufacturing method based on an exposure method or exposure apparatus such as described above will be explained below.

Figure 3:
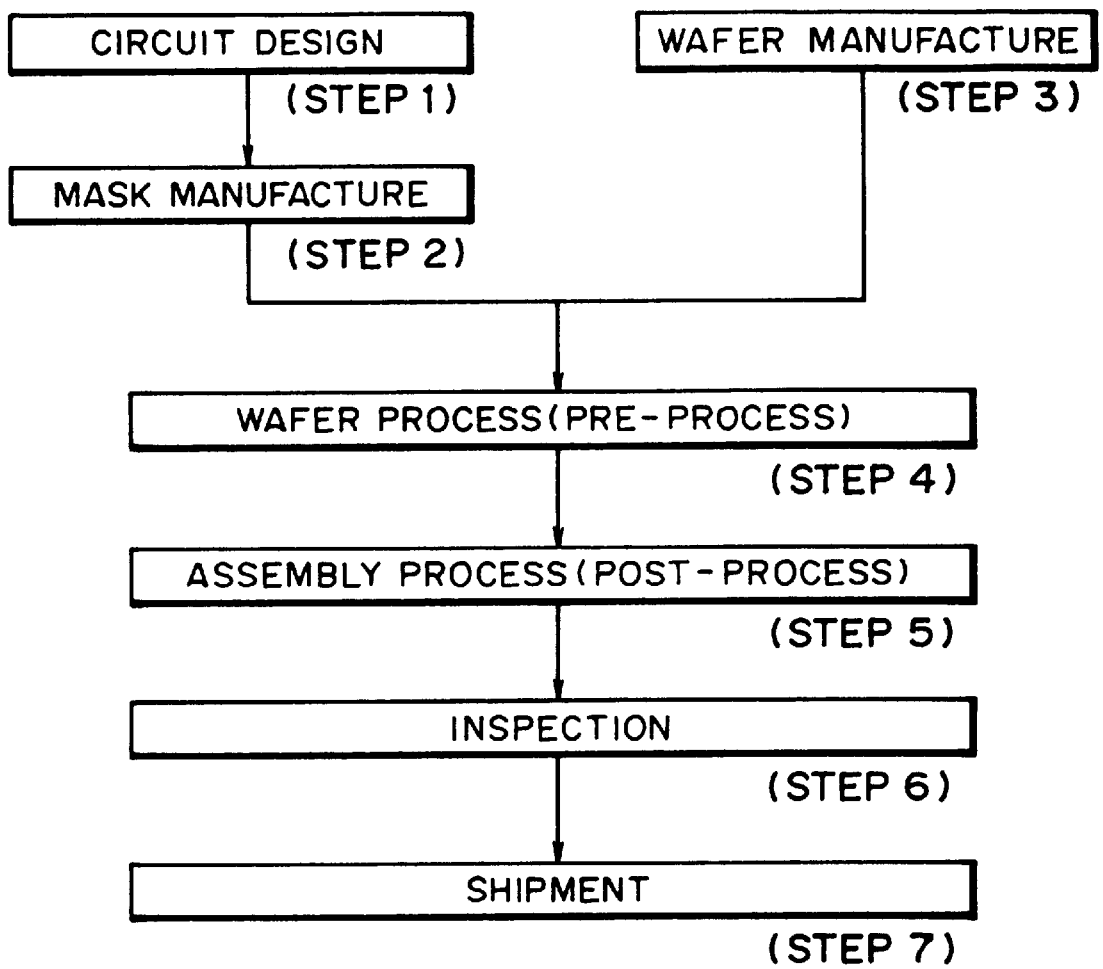
FIG. 3 is a flow chart of device manufacturing processes.

FIG. 3 is a flow chart of process for manufacturing of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the so prepared mask and wafer, circuits are practically formed on the wafer through lithography. Step 5 subsequent to this is an assembling step, which is called a post-process, wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 4:
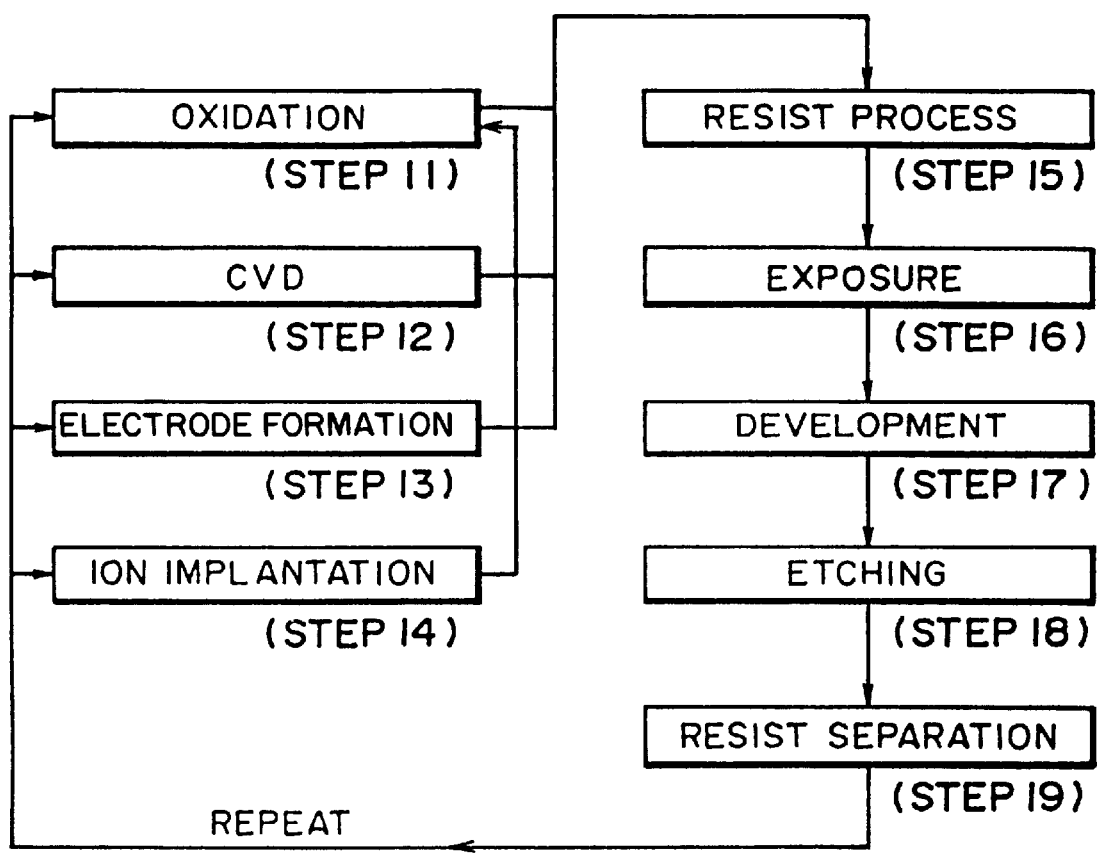
FIG. 4 is a flow chart for explaining details of a wafer process.

FIG. 4 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, large size and high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure method, comprising the steps of:
   holding a reticle fixed;
   holding a wafer fixed;
   irradiating the reticle with an exposure beam;
   projecting an image of the irradiated reticle onto the wafer through a projection optical system;
   determining the temperature of the reticle; and
   re-mounting the reticle when the temperature of the reticle reaches or exceeds a predetermined level as a result of the irradiation with the exposure beam in said irradiating step.

2. A method according to claim 1, wherein in combination with the re-mounting of the reticle, a projection magnification of the projection optical system is adjusted.

3. A method according to claim 1, wherein the re-mounting of the reticle is performed when the wafer is replaced by another.

4. A method according to claim 1, wherein the temperature of the reticle is determined on the basis of integration of an exposure amount.

5. A method according to claim 1, wherein the temperature of the reticle is determined on the basis of the number of exposures and the interval of exposures.

6. A method according to claim 1, wherein the temperature of the reticle is determined on the basis of one of transmissivity and light absorptivity of the reticle as measured beforehand.

7. A method according to claim 1, wherein the re-mounting of the reticle is performed after positioning the reticle.

8. A method according to claim 1, wherein, for re-mounting the reticle, reticle measurement is performed and the reticle re-mounting is made so as to minimize non-linear distortion.

9. A method according to claim 1, wherein the temperature of the reticle is determined on the basis of a difference between (i) relative position of a mark provided on the reticle and a reference mark provided for the positioning of the reticle, and (ii) an initial relative position of the respective marks.

10. A method according to claim 1, wherein holding the reticle is performed by use of vacuum attraction.

11. A device manufacturing method for manufacturing devices with a procedure including a step of transferring a pattern of a reticle onto a wafer in accordance with an exposure method as recited in claim 1.

12. A method according to claim 11, wherein the procedure further includes a step of applying a resist to the wafer prior to the exposure process, and a step of developing the wafer after the exposure process.

13. An exposure method comprising the steps of:
    holding a reticle;
    holding a wafer;
    irradiating the reticle with an exposure beam such that an image of the irradiated reticle is projected onto the wafer;
    determining the temperature of the reticle; and
    re-mounting the reticle when the temperature of the reticle reaches or exceeds a predetermined level as a result of irradiation with the exposure beam in said irradiating step.

14. A method according to claim 13, wherein in combination with the re-mounting of the reticle, a projection magnification of the projection optical system is adjusted.

15. A method according to claim 13, wherein the re-mounting of the reticle is performed when the wafer is replaced by another.

16. A method according to claim 13, wherein the temperature of the reticle is determined on the basis of integration of an exposure amount.

17. A method according to claim 13, wherein the temperature of the reticle is determined on the basis of the number of exposures and the interval of exposures.

18. A method according to claim 13, wherein the temperature of the reticle is determined on the basis of one of transmissivity and light absorptivity of the reticle as measured beforehand.

19. A method according to claim 13, wherein the re-mounting of the reticle is performed after positioning the reticle.

20. A method according to claim 13, wherein, for the re-mounting of the reticle, reticle measurement is performed and the reticle re-mounting is made so as to minimize non-linear distortion.

21. A method according to claim 13, wherein the temperature of the reticle is determined on the basis of a difference between (i) relative position of a mark provided on the reticle and a reference mark provided for the positioning of the reticle, and (ii) an initial relative position of the respective marks.

22. A method according to claim 13, wherein holding the reticle is performed by use of vacuum attraction.

23. A device manufacturing method for manufacturing devices with a procedure including a step of transferring a pattern of a reticle onto a wafer in accordance with an exposure method as recited in claim 13.

24. A method according to claim 23, wherein the procedure further includes a step of applying a resist to the wafer prior to the exposure process, and a step of developing the wafer after the exposure process.

* * * * *